United States Patent
Kordina et al.

(10) Patent No.: US 6,824,611 B1
(45) Date of Patent: Nov. 30, 2004

(54) METHOD AND APPARATUS FOR GROWING SILICON CARBIDE CRYSTALS

(75) Inventors: Olle Claes Erik Kordina, Durham, NC (US); Michael James Paisley, Garner, NC (US)

(73) Assignee: Cree, Inc., Durham, NC (US)

( * ) Notice: Subject to any disclaimer, the term of this patent is extended or adjusted under 35 U.S.C. 154(b) by 449 days.

(21) Appl. No.: 09/415,402

(22) Filed: Oct. 8, 1999

(51) Int. Cl.[7] .......................... C30B 29/36; C30B 25/08
(52) U.S. Cl. ....................... 117/107; 117/105; 117/900; 117/902; 117/935; 117/951
(58) Field of Search ................. 117/105, 107, 117/900, 902, 935, 951; 438/931

(56) References Cited

U.S. PATENT DOCUMENTS

| | | | |
|---|---|---|---|
| 4,664,944 A | * 5/1987 | Hsu et al. | 427/87 |
| 5,363,800 A | * 11/1994 | Larkin et al. | 117/95 |
| RE34,861 E | 2/1995 | Davis et al. | |
| 5,746,827 A | 5/1998 | Barrett et al. | |
| 5,873,937 A | 2/1999 | Hopkins et al. | |
| 5,879,462 A | * 3/1999 | Kordina et al. | 118/725 |
| 5,895,526 A | 4/1999 | Kitoh et al. | |
| 5,915,194 A | * 6/1999 | Powell et al. | 438/478 |
| 5,964,944 A | * 10/1999 | Sugiyama et al. | 117/107 |

FOREIGN PATENT DOCUMENTS

| | | |
|---|---|---|
| DE | 32 30 727 A1 | 2/1984 |
| WO | WO 97/27350 A1 | 7/1997 |

OTHER PUBLICATIONS

O. Kordina et al., "High temperature chemical vapor deposition of SiC", Appl. Phys. Lett. 69 (10), Sep. 2, 1996, pp. 1456–1458.

D. Hofmann et al., "Use of Ta container material for quality improvement of SiC crystals grown by the sublimation technique", Inst. Phys. Conf. Ser. No. 142, Chapter I, paper presented at Silicon Carbide and Related Materials 1995 Conference, Kyoto, Japan, pp. 29–32.

* cited by examiner

Primary Examiner—Robert Kunemund
(74) Attorney, Agent, or Firm—Summa & Allan, P.A.

(57) ABSTRACT

A method and apparatus for controlled, extended and repeatable growth of high quality silicon carbide boules of a desired polytype is disclosed which utilizes graphite crucibles coated with a thin coating of a metal carbide and in particular carbides selected from the group consisting of tantalum carbide, hafnium carbide, niobium carbide, titanium carbide, zirconium carbide, tungsten carbide and vanadium carbide.

22 Claims, 2 Drawing Sheets

METHOD AND APPARATUS FOR GROWING SILICON CARBIDE CRYSTALS

FIELD OF THE INVENTION

The present invention relates to the high temperature growth of large single crystals, and in particular relates to methods and apparatus for the growth of high-quality single crystals of silicon carbide.

BACKGROUND

Silicon carbide is a perennial candidate for use as a semiconductor material. Silicon carbide has a wide bandgap, a low dielectric constant, and is stable at temperatures far higher than temperatures at which other semiconductor materials, such as silicon, become unstable. These and other characteristics give silicon carbide excellent semiconducting properties. Electronic devices made from silicon carbide can be expected to perform, inter alia, at higher temperatures, faster speeds and at higher radiation densities, than devices made from other commonly used semiconductor materials such as silicon.

Those familiar with solid-state physics and the behavior of semiconductors know that a semiconductor material must have certain characteristics to be useful as a material from which electrical devices may be manufactured. In many applications, a single crystal is required, with low levels of defects in the crystal lattice, along with low levels of unwanted chemical and physical impurities. If the impurities cannot be controlled, the material is generally unsatisfactory for use in electrical devices. Even in a pure material, a defective lattice structure can prevent the material from being useful.

Silicon carbide possesses other desirable physical characteristics in addition to its electrical properties. It is very hard, possessing a hardness of 8.5–9.25 Mohs depending on the polytype [i.e., atomic arrangement] and crystallographic direction. In comparison, diamond possesses a hardness of 10 Mohs. Silicon carbide is brilliant, possessing a refractive index of 2.5–2.71 depending on the polytype. In comparison, diamond's refractive index is approximately 2.4. Furthermore, silicon carbide is a tough and extremely stable material that can be heated to more than 2000° C. in air without suffering damage. These physical characteristics make silicon carbide an ideal substitute for naturally occurring gemstones. The use of silicon carbide as gemstones is described in U.S Pat. Nos. 5,723,391 and 5,762,896 to Hunter et al.

Accordingly, and because the physical characteristics and potential uses for silicon carbide have been recognized for some time, a number of researchers have suggested a number of techniques for forming crystals of silicon carbide. These techniques generally fall into two broad categories, although it will be understood that some techniques are not necessarily so easily classified. The first technique is known as chemical vapor deposition (CVD) in which reactants and gases are introduced into a system within which they form silicon carbide crystals upon an appropriate substrate.

The other main technique for growing silicon carbide crystals is generally referred to as the sublimation technique. As the designation "sublimation" implies, sublimation techniques generally use some kind of solid silicon carbide starting material, which is heated until the solid silicon carbide sublimes. The vaporized silicon carbide starting material is then encouraged to condense on a substrate, such as a seed crystal, with the condensation intended to produce the desired crystal polytype.

One of the first sublimation techniques of any practical usefulness for producing better crystals was developed in the 1950s by J. A. Lely, and is described in U.S. Pat. No. 2,854,364. From a general standpoint, Lely's technique lines the interior of a carbon vessel with a silicon carbide source material. By heating the vessel to a temperature at which silicon carbide sublimes, and then allowing it to condense, re-crystallized silicon carbide is encouraged to deposit along the lining of the vessel.

The Lely sublimation technique was modified and improved upon by several researchers. Hergenrother, U.S. Pat. No. 3,228,756 ("Hergenrother '756") discusses another sublimation growth technique, which utilizes a seed crystal of silicon carbide upon which other silicon carbide condenses to grow a crystal. Hergenrother '756 suggests that in order to promote proper growth, the seed crystal must be heated to an appropriate temperature, generally over 2000° C. in such a manner that the time period during which the seed crystal is at temperatures between 1800° C. and 2000° C. is minimized.

Ozarow, U.S. Pat. No. 3,236,780 ("Ozarow '780") discusses another unseeded sublimation technique which utilizes a lining of silicon carbide within a carbon vessel. Ozarow '780 attempts to establish a radial temperature gradient between the silicon carbide lined inner portion of the vessel and the outer portion of the vessel.

Knippenberg, U.S. Pat. No. 3,615,930 ("Knippenberg '930") and U.S. Pat. No. 3,962,406 ("Knippenberg '406") discuss alternative methods for growing silicon carbide in a desired fashion. The Knippenberg '930 patent discusses a method of growing p-n junctions in silicon carbide as a crystal grows by sublimation. According to the discussion in this patent, silicon carbide is heated in an enclosed space in the presence of an inert gas containing a donor type dopant atom. The dopant material is then evacuated from the vessel and the vessel is reheated in the presence of an acceptor dopant. This technique is intended to result in adjacent crystal portions having opposite conductivity types thereby forming a p-n junction.

The Knippenberg '406 patent discusses a three-step process for forming silicon carbide in which a silicon dioxide core is packed entirely within a surrounding mass of either granular silicon carbide or materials that will form silicon carbide. The packed mass of silicon carbide and silicon dioxide is then heated. The system is heated to a temperature at which a silicon carbide shell forms around the silicon dioxide core, and then further heated to vaporize the silicon dioxide from within the silicon carbide shell. Finally, the system is heated even further to encourage additional silicon carbide to continue to grow within the silicon carbide shell.

Vodakov, U.S. Pat. No. 4,147,572 discusses a geometry oriented sublimation technique in which solid silicon carbide source material and seed crystals are arranged in a parallel close proximity relationship to another.

Addamiano, U.S. Pat. No. 4,556,436 ("Addamiano '436") discusses a Lely-type furnace system for forming thin films of beta silicon carbide on alpha silicon carbide which is characterized by a rapid cooling from sublimation temperatures of between 2300° C. and 2700° C. to another temperature of less than 1800° C. Addamiano '436 notes that large single crystals of cubic (beta) silicon carbide are simply not available and that growth of silicon carbide or other materials such as silicon or diamond is rather difficult.

Hsu, U.S. Pat. No. 4,664,944, discusses a fluidized bed technique for forming silicon carbide crystals which resembles a chemical vapor deposition technique in its use of non-silicon carbide reactants, but which includes silicon carbide particles in the fluidized bed, thus somewhat resembling the sublimation technique.

German (Federal Republic) Patent No. 3,230,727 to Siemens Corporation discusses a silicon carbide sublimation technique in which the emphasis of the discussion is the minimization of the thermal gradient between a silicon carbide seed crystal and silicon carbide source material. This patent suggests limiting the thermal gradient to no more than 20° C. per centimeter of distance between source and seed in the reaction vessel. This patent also suggests that the overall vapor pressure in the sublimation system be kept in the range of between 1 and 5 millibar and preferably around 1.5 to 2.5 millibar.

Davis, U.S. Pat. No. Re. 34,861 ("Davis '861") discuss a method of forming large device quality single crystals of silicon carbide. This patent presents a sublimation process enhanced by maintaining a constant polytype composition and size distribution in the source materials. These patents also discuss specific preparation of the growth surface and seed crystals and controlling the thermal gradient between the source materials and the seed crystal.

Barrett, U.S. Pat. No. 5,746,827 ("Barrett '827") discusses a method for producing large diameter silicon carbide crystals requiring two growth stages. The first growth stage is to isothermally grow a seed crystal to a larger diameter. The second growth stage is to grow a large diameter boule from the seed crystal under thermal gradient conditions.

Hopkins, U.S. Pat. No. 5,873,937 ("Hopkins '937") discusses a method for growing 4H silicon carbide crystals. This patent teaches a physical vapor transport (PVT) system where the surface temperature of the crystal is maintained at less than about 2160° C. and the pressure inside the PVT system is decreased to compensate for the lower growth temperature.

Kitoh, U.S. Pat. No. 5,895,526 ("Kitoh '526") teaches a sublimation process for growing a single silicon carbide crystal where the sublimed source material flows parallel with the surface of a single crystal substrate.

Although significant progress in the production of SiC crystals has occurred over the years, commercially significant goals still remain for SiC crystal production. For example, faster and more powerful prototype devices are being developed that require larger SiC crystals that maintain or improve upon current crystal quality. Boules large enough to produce 50-mm diameter SiC wafers are currently at the far end of commercially viable SiC production. 75-mm diameter wafers of good quality have been demonstrated but are not yet commercially available and there is already a need for 100-mm wafers. Many SiC crystal production techniques are simply incapable of economically and consistently producing crystals of the size and quality needed. The primary reason for the inability of most crystal production techniques to keep up with commercial demand lies within the chemistry of SiC.

The chemistry of silicon carbide sublimation and crystallization is such that the known methods of growing silicon carbide crystals are difficult, even when carried out successfully. The stoichiometry of the crystal growth process is critical and complicated. Too much or too little silicon or carbon in the sublimed vapor may result in a crystal having an undesired polytype or imperfections such as micropipes.

Likewise, the high operating temperatures, typically above 2100° C. and the necessity of forming specific temperature gradients within the crystal growth system pose significant operational difficulties. The traditional graphite sublimation containers utilized in most sublimation systems possess infrared emissivities on the order of 0.85 to 0.95 depending upon the container's surface characteristics. Seed crystals are heat sensitive to infrared radiation. Therefore, the infrared radiation emitted by the graphite containers can overheat the seed crystal thereby complicating the precise temperature gradients necessary for successful operation of sublimation systems.

Recently, the SiC group at Linköping University presented a technique for the growth of SiC called High Temperature Chemical Vapor Deposition ("HTCVD"). O. Kordina, et al., "High Temperature Chemical Vapor Deposition," paper presented at the International Conference on SiC and Related Materials, Kyoto, Japan, 1995; See also O. Kordina, et al., 69 Applied Physics Letters, 1456 (1996). In this technique, the solid silicon source material is replaced by gases such as silane. The use of gaseous source materials improves control of the reaction stoichiometry. The solid carbon source material may also be replaced by a gas such as propane; however, most of the carbon utilized in this technique actually comes from the graphite walls of the crucible. Theoretically, this technique's utilization of a continuous supply of gas would allow continuous and extended SiC boule growth. Unfortunately, the HTCVD technique has not proven commercially useful for boule growth primarily because the reaction destroys the graphite crucibles used in the process. Furthermore, the addition of hydrocarbon gases in this particular process tends to produce Si droplets encrusted with SiC which decreases efficiency and also ties up Si and C thereby altering the stoichiometry of the system.

Perhaps the most difficult aspect of silicon carbide growth is the reactivity of silicon at high temperatures. Silicon reacts with the graphite containers utilized in most sublimation processes and, as noted above, is encouraged to do so in some applications. This reaction is difficult to control and usually results in too much silicon or too much carbon being present in the system thus undesirably altering the stoichiometry of the crystal growth process. In addition, silicon's attack on the graphite container pits the walls of the container destroying the container and forming carbon dust which contaminates the crystal.

In attempts to resolve these problems, some research has evaluated that the presence of tantalum in a sublimation system, e.g., Yu. A. Vodakov et al, "The Use of Tantalum Container Material for Quality Improvement of SiC Crystals Grown by the Sublimation Technique," presented at the 6$^{th}$ International Conference on Silicon Carbide, September 1995, Kyoto, Japan. Some researchers opine that the presence of tantalum helps maintain the required stoichiometry for optimal crystal growth. Such an opinion is supported by reports that sublimation containers comprising tantalum are less susceptible to attack by reactive silicon.

In a related application, WO97/27350 ("Vodakov '350") Vodakov presents a sublimation technique similar to that presented in U.S. Pat. No. 4,147,572 and attempts to address the problem of silicon attacking the structural components of the sublimation system. Vodakov '350 describes a geometry oriented sublimation technique in which solid silicon carbide source materials and seed crystals are arranged in parallel close proximity relationship to another. Vodakov '350 utilizes a sublimation container made of solid tantalum. The inner surface of Vodakov's tantalum container is described as being an alloy of tantalum, silicon and carbon. Page 11, line 26 through page12, line 10. Vodakov claims that such a container is resistive to attack by silicon vapor and contributes to well-formed silicon carbide crystals.

The cost of tantalum is, however, a drawback to a sublimation process utilizing the container described in Vodakov. A sublimation container of solid tantalum is extremely expensive and like all sublimation containers, will eventually fail, making its long-term use uneconomic. A solid tantalum sublimation container is also difficult to machine. Physically forming such a container is not an easy task. Lastly, the sublimation process of Vodakov '350 suffers the same deficiency shown in other solid source sublimation techniques in that it is not efficient at forming the large, high quality boules needed for newly discovered applications.

Therefore, a need exists for a process that provides for controlled, extended and repeatable growth of high quality SiC crystals. Such a system must necessarily provide a container that is resistive to attack by silicon. Such a system should also be economical to implement and use.

OBJECT AND SUMMARY OF THE INVENTION

Accordingly, an object of the present invention is to provide a method and apparatus for the controlled, extended and repeatable growth of high quality silicon carbide crystals of a desired polytype.

A further object of the present invention is to provide a method of growing high. quality single crystals of silicon carbide by controlling the stoichiometry of the crystal growth process.

A further object of the present invention is to provide a method of growing high quality single crystals of silicon carbide by controlling the temperature of the crystal growth process.

A further object of the present invention is to provide a method and apparatus for growing high quality single crystals of silicon carbide by reducing or eliminating impurities resulting from degradation of the physical components of the system.

A still further object of the present invention is to provide for a system for SiC crystal growth that resists reaction with vaporized silicon.

The invention meets these objects with a method and apparatus for growing large single crystals of SiC for use in producing electrical devices and for use as gemstones. In particular, the invention encompasses introducing a monocrystalline seed crystal of SiC of a desired polytype and a source of silicon and a source of carbon into SiC crystal growth system typically comprising a crucible and a furnace. The source of silicon and carbon is then raised to a temperature sufficient for the formation of vaporized species containing silicon and carbon. The temperature of the seed crystal is raised to a temperature approaching but lower than the temperature of the silicon and carbon vapors and lower than that at which SiC will sublime faster than deposit under the gas pressure conditions within the crucible, thus creating a temperature gradient within the crucible.

A suitable flow of a vaporized species containing silicon and carbon derived from the source of silicon and the source of carbon is generated and maintained within the crucible. The flow of vapor is directed to the growth surface of the seed crystal for a time sufficient to produce a desired amount of macroscopic growth of monocrystalline SiC while substantially preventing any silicon containing species from reacting with material utilized in constructing the SiC crystal growth system.

The foregoing and other objects, advantages and features of the invention, and the manner in which the same is accomplished will become more readily apparent upon consideration of the following detailed description of the invention taken in conjunction with the accompanying drawings, which illustrate preferred and exemplary embodiments and wherein:

DETAILED DESCRIPTION

As will be readily apparent to those skilled in the art, the following disclosure may be easily adapted and incorporated into virtually all known methods for producing SiC crystals.

Accordingly, the following detailed description will begin with a general discussion of the invention. Additional embodiments demonstrating the versatility of the invention will follow.

A preferred embodiment of the invention is a gas fed sublimation (GFS) system in which the source of silicon and the source of carbon are gaseous. The gaseous silicon and carbon sources are fed to a reaction chamber where they react at high temperatures, typically above 2000° C., to form vaporized species containing silicon and carbon. In addition to carbon (C) and silicon (Si), such species typically include SiC, $Si_2C$, and $SiC_2$. The vaporized species are then deposited onto a monocrystalline seed crystal of a desired polytype. Such a system is schematically disclosed in FIG. 1.

Figure 1:
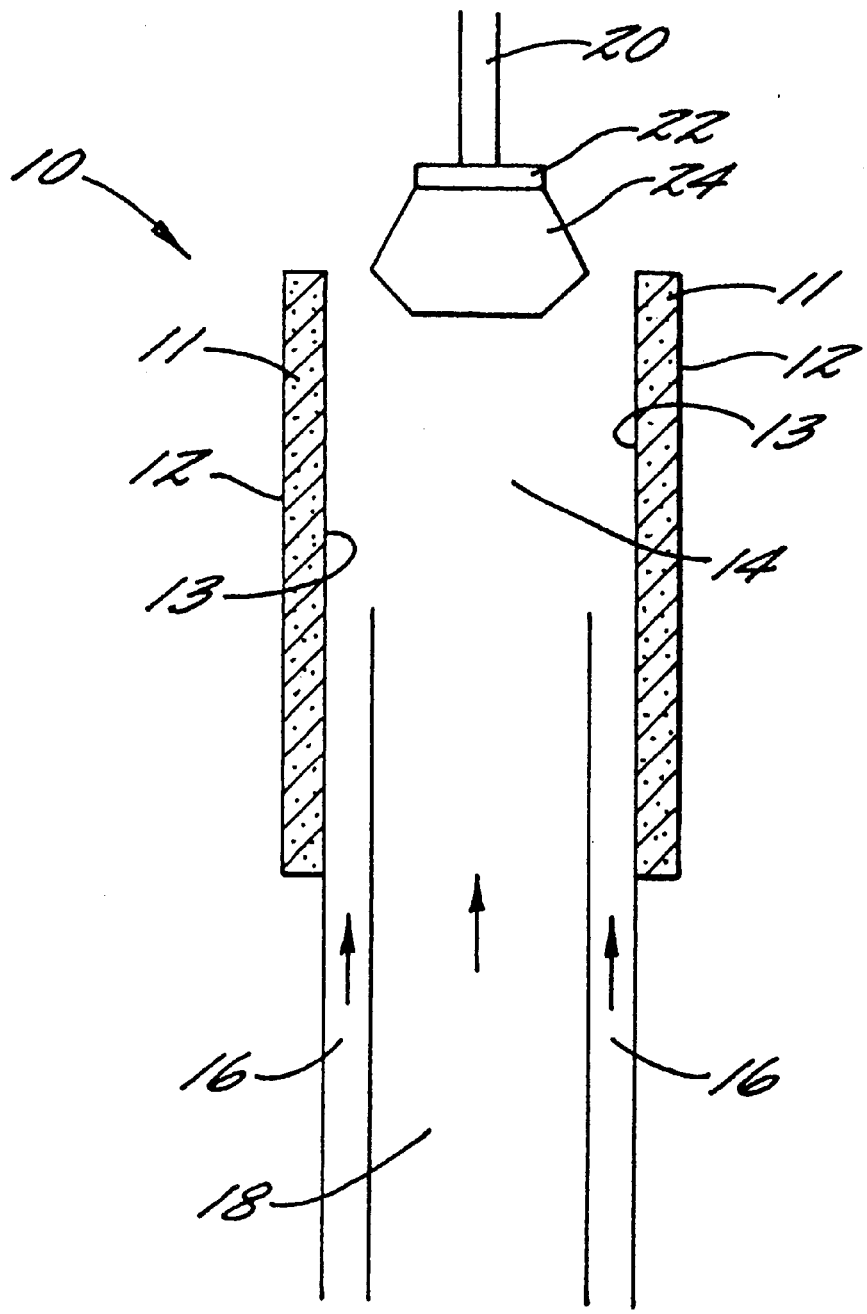
FIG. 1 is a schematic representation of a crystal growth system in accordance with the invention.

The GFS system of FIG. 1 comprises a crucible broadly designated at 10. It is to be understood that the crucible 10 is a substantially enclosed structure similar to the type normally used in SiC sublimation techniques. Reference is made to the crucible 12 in Barrett '827; the growth chamber 10 of Hopkins '937; and the crucibles shown in FIGS. 1, 4, 5 and 6 of Davis '861 as being exemplary, but not limiting, of the crucibles, vessels, or containers of the present invention. These references also demonstrate that the broad parameters of sublimation growth are relatively well understood in this art. Accordingly, these will not be addressed in detail herein, other than to describe the features of the present invention. The crucible 10 is generally cylindrical in shape and includes a cylindrical wall 11 having an outer surface 12 and an inner surface 13. The cylindrical wall 11 is made of graphite coated with material characterized by a melting point above the sublimation temperature of SiC. The coating material is also characterized by chemical inertness with respect to silicon and hydrogen at the temperatures in question. Metal carbides and particularly the carbides of tantalum, hafnium, niobium, titanium, zirconium, tungsten and vanadium and mixtures thereof exhibit the desired characteristics of the required coating. Metal nitrides, and particularly the nitrides of tantalum, hafnium, niobium, titanium, zirconium, tungsten and vanadium and mixtures thereof also exhibit the desired characteristics of the required coating. Furthermore, mixtures of metal carbides and metal nitrides such as those listed previously may be used as the coating substance. For ease of discussion and reference, the remainder of the detailed description will refer to metal carbides although it is understood that the concepts and principles discussed herein are equally applicable to metal nitride coatings.

In all instances described herein, it is to be understood that graphite components exposed to the source materials are coated with a metal carbide coating. The metal carbide coating may be provided by any of several commercially available coating processes such at that practiced by Ultramet Corporation of Pacoima, Calif. or Advance Ceramics Corporation of Lakewood, Ohio. Additionally, the graphite components described herein are made from a graphite which has approximately the same coefficient of thermal expansion as the selected metal carbide. Such materials are commercially available. The relative similarities of thermal coefficients of expansion are a particular requirement for materials heated to the extremely high temperatures described herein. In this manner, the likelihood of the graphite or metal carbide coating cracking during the crystal growth process is substantially reduced and the lifetime of the crucible will generally be increased.

The cylindrical wall 11 radially encloses a reaction area generally designated at 14. Outer 16 and inner 18 concentric source gas pathways supply the source gas materials to the reaction area 14. Although the source gases could be mixed prior to entering the reaction area 14, separation of the source gases until each gas is heated to approximately the reaction temperature helps prevent any undesired side reactions between the silicon source gas and the carbon source gas. The concentric source gas pathways keep the source gas materials separated from one another until the point where the source gases enter the reaction area 14. In a preferred embodiment the outer concentric source gas pathway 16 supplies the carbon source gas to the reaction area 14 and the inner concentric source gas pathway 18 supplies the silicon source gas.

In typical sublimation systems the graphite walls of the crucible are used as a source of carbon. The metal carbide coating of the claimed invention diminishes the availability of this source of carbon although it appears that under certain circumstances the coated graphite may still act as a source of some carbon for the system. Accordingly, the majority of the carbon needed is supplied from an outside source, such as a carbon source gas. Suitable carbon source gases include any hydrocarbon capable of reacting with Si to form SiC: $C_2$ to $C_8$ hydrocarbons and in particular ethylene ($C_2H_4$) work well in the claimed invention. The carbon source gas stream may also comprise one or more carrier gases such as He or $H_2$.

Suitable silicon source gases include any gas which will react with available carbon to form SiC. Silane ($SiH_4$) is probably the most well-known of the possible silicon source gases and works well in the claimed invention. Other suitable sources of silicon include chlorosilane ($SiH_4-xCl_x$) and methyltrichlorosilane ($CH_3SiCl_3$). Chlorosilanes require $H_2$ to react, however. The silicon source gas stream may also comprise a suitably inert carrier gas such as He.

A seed crystal 22 is secured on a seed holder 20 and lowered into the reaction area 14. The source gases react within the reaction area 14 to form SiC vapor which eventually deposits on the surface of the seed crystal 22 to form a boule 24. It is believed that at least a portion of the SiC first deposits on the inner wall 13, then sublimes to recondense on the growth surface (seed crystal 22 or boule 24). Under most circumstances, the seed crystal is preferably SiC of the same polytype as the desired growth.

The composition of the source gases may be kept constant or varied during the growth process depending upon the required stoichiometry, type of crystal desired and the physical characteristics of the crystal growth system.

Those familiar with the physical chemistry of solids, liquids and gases know that crystal growth is in most circumstances encouraged on a growth surface if the surface is at a somewhat lower temperature than the fluid (either gas or liquid) which carries the molecules or atoms to be condensed. The GFS system is no exception. A thermal gradient is established between the growth surface and the source material. Although the exact dimensions of the temperature gradient may vary depending upon the pressure of the system, desired polytype, source gas composition, etc., the following general principle is usually applicable to all types of SiC crystal growth processes, including the GFS system. The temperature of the silicon source and carbon source should be raised to a temperature sufficient for the formation of the vaporized species while the temperature of the crystal growth surface is elevated to a temperature approaching the temperature of silicon and carbon sources, but lower than the temperature of the silicon and carbon sources, and lower than that at which SiC will sublime faster than deposit under the gas pressure conditions utilized.

As stated above, numerous variables determine the appropriate temperature gradient for a given system. However, a system such as that described in FIG. 1 has been discovered to operate well at seed temperatures between about 1900° C. and about 2500° C. with the inner walls of the reaction area being about 150° C. to about 200° C. hotter than the seed. The maximum growth rate for such a system has yet to be determined. Higher temperatures are known to generally translate into faster growth rates. Higher temperatures, however, can result in sublimation of the seed, which alters the equilibrium of the system and requires additional source gas and potentially other adjustments as well.

The GFS system of FIG. 1 has demonstrated the ability to produce very large high quality crystals of SiC. More importantly, the GFS system of FIG. 1 has demonstrated an ability to withstand attack from the Si compounds that eventually destroy typical graphite crucibles. A test crucible of graphite coated with an approximately 30 micron thick coating of TaC emerged from a crystal growth session unaffected by the harsh environment. Only after several runs have cracks appeared in test crucibles, usually near a sharp corner where the metal carbide coating was less than optimum. However, even when the coating cracks, the crystal growth system is not subject to the carbon dust typically formed when a graphite crucible's integrity is compromised.

The explanation for this surprising property is not fully understood. Although the inventors do not wish to be bound by any particular theory, one possible explanation is that when uncoated graphite is attacked by Si, the Si predominately attacks the weak parts of the graphite, i.e., at the grain boundaries penetrating into the pores. The Si forms SiC which sublimes and is removed as a volatile species. Eventually Si completely erodes the graphite surrounding the grain, leaving the grain behind as a carbon dust particle. It is believed that the metal carbide coating penetrates deep within the graphite pores causing the Si to attack the graphite in a more uniform manner, thereby avoiding the generation of carbon dust.

Suprisingly, a graphite crucible once coated with a metal carbide resists the formation of carbon dust even after substantial spalling of the metal carbide coating. Accordingly, an alternative embodiment of the invention is a GFS system comprising a graphite crucible which has at one time been coated with a metal carbide coating but which through use or other circumstances has lost some or all of its metal carbide coating. Such a system is capable is producing quality SiC crystals without contamination from carbon dust.

Additionally, the GFS system of FIG. 1 has demonstrated the ability to provide improved control of the temperature gradients within the crystal growth system. As discussed previously, seed crystals are sensitive to infrared radiation and graphite possesses an infrared emissivity of between about 0.85 to about 0.95 depending upon the surface of the graphite. In contrast the infrared emissivity of the metal compound coatings of the invention range from approximately 0.4 for ZrC to approximately 0.5 for TaC to approximately 0.6 for NbC. The lower emissivities of the metal compound coatings of the claimed invention substantially reduce the amount of infrared radiation impinging upon the seed crystal during crystal growth and can result in a 100° C. or more reduction in seed temperature when compared to uncoated graphite systems. Reducing the amount of infrared radiation removes a potential source of excess heat from the system thereby improving control of the temperature gradients within the system.

It is readily apparent to one skilled in the art that the utilization of a metal carbide coated crucible as described above is readily adaptable to existing SiC crystal growth systems. It will be additionally apparent to those familiar with this art that the use of metal carbide-coated crucibles according to the present invention need not be limited to the sublimation growth of SiC. Thus, although the invention offers particular advantages with respect to SiC growth, the coatings and coated crucibles, vessels or containers described herein offer structural and functional advantages for the growth of other materials, including other wide band-gap semiconductor materials such as the Group III nitrides, and particularly including gallium nitride (GaN). For example, some researchers have reported a link between the presence of carbon and a yellow luminescence in GaN and non-uniform electrical behavior in In-containing nitrides. Pearton et al, GaN: *Processing, Defects and Devices,* 86 Applied Physics Reviews, 1 (July 1999). The utilization of the coated apparatus and method of the invention advantageously reduces the availability of carbon as a potential residual impurity in MOCVD nitrides. Additional embodiments evidencing the versatility of the claimed invention follow.

Figure 2:
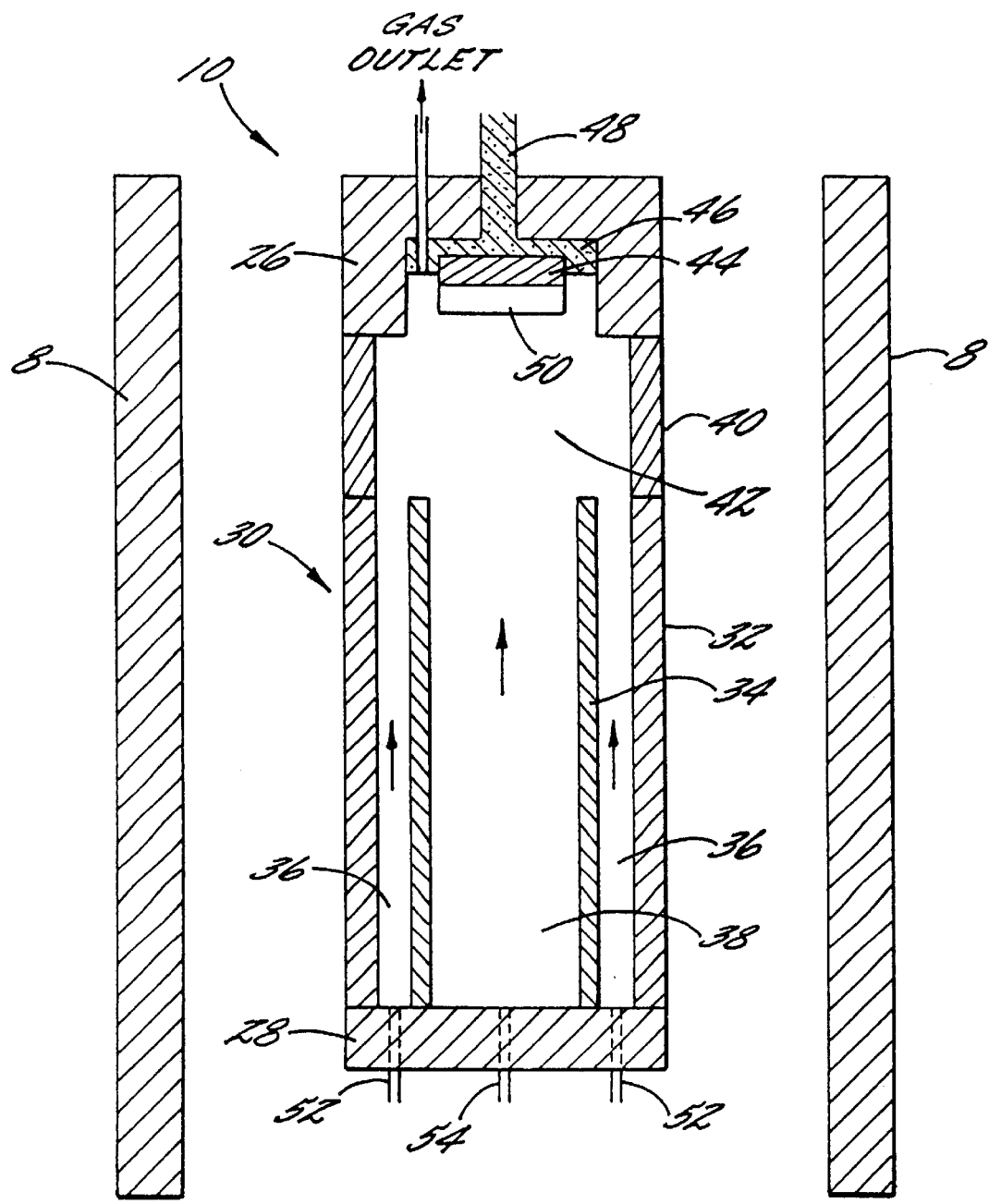
FIG. 2 is a cross-sectional diagram of a gas fed sublimation system used in accordance with the method of the claimed invention.

FIG. 2 illustrates a cross-sectional view of another GFS system used in accordance with the method of the present invention. The crucible is broadly designated at 10. The crucible 10 is located within a furnace indicated generally at 8. Methods and apparatus, such as a furnace, for supplying heat to SiC and other crystal growth systems are well known to those skilled in the art, and thus will not be otherwise discussed in detail herein.

The crucible 10 is generally cylindrical in shape and includes a lid 26 and a bottom 28 that substantially encloses an intermediate cylindrical portion 30. The intermediate cylindrical portion 30 comprises an outer cylinder 32 having a top and a bottom and an inner diameter and an outer diameter. Situated within the inner diameter of the outer cylinder 32 is an inner cylinder 34 also having a top and a bottom, and an inner diameter and an outer diameter. The outer cylinder 32 and the inner cylinder 34 form inner 38 and outer 36 concentric gas pathways.

In a preferred embodiment the intermediate cylindrical portion 30 also comprises at least one spacer ring 40 situated between the outer cylinder 32 and the lid 26. The spacer ring 40 is defined by an inner diameter and an outer diameter with said inner diameter being less than the outer diameter of the inner cylinder 34. The spacer ring 40 and the lid 26 generally define a reaction area 42 above the outer and inner cylinders 32 and 34 respectively. It is to be understood that the spacer ring 40 is an optional component. When used, however, the spacer ring 40 preferably incorporates the refractory metal carbide coating of the present invention. Alternatively, the outer cylinder 32 can be extended to replace the spacer ring 40. However, the use of a spacer ring or rings is recommended because of the flexibility provided in adjusting the size of the reaction area 42 and thus the thermal gradient. In a further alternative, the spacer ring 40 can be used in conjunction with other similarly shaped devices such as a growth disk (a ring with a venturi-like opening that focuses upward flowing SiC vapor) or a collection disk (a porous disk that allows SiC vapor to flow upward while collecting solid particles that fall from the walls of the crucible). Collecting these particles onto a hot collection disk permits them to resublime and contribute to the growth of the crystal.

Extending into the reaction area 42 from the lid 26 is a seed crystal 44 supported by a seed holder 46 and a graphite rod 48. The seed crystal 44 acts as a substrate for the growth of a SiC boule 50.

Two gas sources 52 and 54 are in fluid communication with the inner and outer concentric gas pathways and provide the silicon and carbon source gases utilized in the SiC crystal growth process. In a preferred embodiment one gas source 52 supplies the carbon source gas to the outer concentric gas pathway 36 and the other gas source 54 supplies the silicon source gas to the inner concentric gas pathway 38. The reaction to form SiC vapor and the desired SiC boule proceeds as previously described with respect to FIG. 1. A gas outlet 27 incorporated into the lid 26 and extending through the underlying seed holder 46 provides a means for evacuation of gas from the reaction area 42.

It will be further understood that relevant portions of the systems referred to earlier (e.g., Davis, Vodakov, etc.) could be modified and improved to incorporate the coated surfaces, vessels, and systems described herein, and would thus fall within the parameters of the present invention.

The invention has been described in detail, with reference to certain preferred embodiments, in order to enable the reader to practice the invention without undue experimentation. However, a person having ordinary skill in the art will readily recognize that many of the components and parameters may be varied or modified to a certain extent without departing from the scope and spirit of the invention. Furthermore, titles, headings, or the like are provided to enhance the reader's comprehension of this document, and should not be read as limiting the scope of the present invention. Accordingly, the intellectual property rights to the invention are defined only by the following claims and reasonable extensions and equivalents thereof.

That which is claimed is:

1. A method of controlling and encouraging the growth of high quality SiC single crystals in a SiC crystal growth system, the method comprising directing and maintaining a flow of silane and a carbon source gas to a reaction area while heating the silane and the carbon source gas to approximately the reaction temperature;

reacting the silane and the carbon source gas in the reaction area to form a vaporized species containing carbon and silicon;

directing and maintaining a flow of the vaporized species containing carbon and silicon to a SiC seed crystal under conditions of temperature and pressure at which single crystal growth of silicon carbide will take place upon the seed crystal;

substantially preventing the silane from reacting with ambient surroundings other than the carbon source gas by introducing the silane into a SiC crystal growth system comprising graphite that is coated with a material characterized by a melting point above the sublimation temperature of SiC, chemical inertness with respect to silicon and hydrogen at the sublimation temperature, and a coefficient of thermal expansion sufficiently similar to the graphite to prevent cracking between the graphite and the coating at the sublimation temperature.

2. A method according to claim 1 wherein the material coating the graphite is a refractory metal compound selected from the group consisting of tantalum carbide, hafnium carbide, niobium carbide, titanium carbide, zirconium carbide, tungsten carbide, vanadium carbide, tantalum nitride, hafnium nitride, niobium nitride, titanium nitride, zirconium nitride, tungsten nitride vanadium nitride and mixtures thereof.

3. A method according to claim 2 wherein the refractory metal compound comprises tantalum carbide.

4. A method of growing high quality single crystals of SiC in a SiC crystal growth system, the method comprising:

providing a silane source and a carbon source gas;

raising the temperatures of the silane and the carbon gas source to a temperature sufficient for the formation of silicon carbide vapor; while elevating the temperature of the growth surface of a seed crystal to a temperature approaching the temperature of the silane and carbon source gas, but lower than the temperature of the silane and carbon source gas and lower than the temperature at which silicon carbide will sublime under the gas pressure conditions of the SiC crystal growth system; and generating and maintaining a suitable flow of a vaporized species containing carbon and silicon derived from the silane and the carbon source gas; said flow of vapor being directed to the growth surface of the seed crystal for a time sufficient to produce a desired amount of macroscopic growth of monocrystalline silicon carbide; while substantially preventing the silane from reacting with ambient surroundings other than the carbon source gas by introducing the silane into a SiC crystal growth system comprising graphite that is coated with a material characterized by a melting point above the sublimation temperature of SiC, chemical inertness with respect to silicon and hydrogen at the sublimation temperature, and a coefficient of thermal expansion sufficiently similar to the graphite to prevent cracking between the graphite and the coating at the sublimation temperature.

5. A method according to claim 4 wherein the material coating the graphite is a refractory metal compound selected from the group consisting of tantalum carbide, hafnium carbide, niobium carbide, titanium carbide, zirconium carbide, tungsten carbide, vanadium carbide, tantalum nitride, hafnium nitride, niobium nitride, titanium nitride, zirconium nitride, tungsten nitride, vanadium nitride and mixtures thereof.

6. A method according to claim 5 wherein said refractory metal compound comprises tantalum carbide.

7. A method according to claim 4 wherein the carbon source gas is ethylene.

8. A method of growing high quality single crystals of SiC in a SiC crystal growth system, the method comprising:

introducing a monocrystalline seed crystal of SiC of a desired polytype, silane, and a carbon source gas into a SiC crystal growth system where the carbon source gas and the silane are separated until each gas is heated to approximately the reaction temperature;

raising the temperature of the silane and the carbon source gas to a temperature sufficient to form vaporized species containing carbon and silicon; while elevating the temperature of the growth surface of the seed crystal to a temperature approaching the temperature of the silane and carbon source gas, but lower than the temperature of the silane and carbon source gas and lower than the temperature at which SiC will sublime under the gas pressure conditions of the SiC crystal growth system;

generating and maintaining a suitable flow of vaporized species containing carbon and silicon derived from the silane and the carbon source gas; with the flow of vapor being directed to the growth surface of the seed crystal for a time sufficient to produce a desired amount of macroscopic growth of monocrystalline SiC on the seed crystal; and substantially preventing the silane from reacting with ambient surroundings other than the carbon source gas by introducing the silane into a SiC crystal growth system comprising graphite that is coated with a material characterized by a melting point above the sublimation temperature of SiC, chemical inertness with respect to silicon and hydrogen at the sublimation temperature, and a coefficient of thermal expansion sufficiently similar to the graphite to prevent cracking between the graphite and the coating at the sublimation temperature.

9. A method according to claim 8 wherein the material coating the graphite is a refractory metal compound selected from the group consisting of tantalum carbide, hafnium carbide, niobium carbide, titanium carbide, zirconium carbide, tungsten carbide, vanadium carbide, tantalum nitride, hafnium nitride, niobium nitride, titanium nitride, zirconium nitride, tungsten nitride, vanadium nitride and mixtures thereof.

10. A method according to claim 9 wherein the refractory metal compound comprises tantalum carbide.

11. A method according to claim 8 wherein the carbon source gas comprises ethylene.

12. A method according to claim 8 further comprising the step of preparing a polished seed crystal of silicon carbide prior to the step of introducing the seed crystal of silicon carbide into the SiC crystal growth system.

13. A method according to claim 8 wherein the step of raising the temperature of the silane and the carbon source gas comprises raising the temperature of the silane and the carbon source gas to between about 2200° and 2400° centigrade.

14. A method according to claim 13 wherein the step of raising the temperature of the silane and the carbon source gas comprises raising the temperature of the silane and the carbon source gas to about 2300° centigrade.

15. A method according to claim 8 wherein the step of elevating the temperature of the seed crystal comprises elevating the temperature of the seed crystal to between about 2150° and 2250° centigrade.

16. A method according to claim 15 wherein the step of elevating the temperature of the seed crystal comprises elevating the temperature of the seed crystal to about 2200° centigrade.

17. A method according to claim 8 wherein the step of generating and maintaining a substantially constant flow of the vaporized species comprises maintaining the selected composition of silicon and carbon in the reaction area substantially constant throughout the growth process.

18. A method according to claim 8 wherein the step of generating and maintaining a substantially constant flow of the vaporized species comprises modifying the selected composition of silicon and carbon throughout the crystal growth process as required to maintain the requisite crystal growth.

19. A method of controlling and encouraging the growth of high quality SiC single crystals in a SiC crystal growth system, the method comprising directing and maintaining a flow of silane and a carbon source gas to a reaction area while heating the silane and the carbon source gas to approximately the reaction temperature;

reacting the silane and the carbon source gas in the reaction area to form vaporized species containing carbon and silicon;

reducing the exposure of a SiC seed crystal to infrared radiation while directing and maintaining the flow of vaporized species comprising carbon and silicon to the SiC seed crystal under conditions of temperature and pressure at which single crystal growth of SiC will take place upon the seed crystal;

wherein the step of reducing the exposure of a SiC seed crystal to infrared radiation comprises introducing the seed crystal into a SiC crystal growth system comprising graphite that is coated with a material characterized by a melting point above the sublimation temperature of SiC, chemical inertness with respect to silicon and hydrogen at the sublimation temperature, and a coefficient of thermal expansion sufficiently similar to the graphite to prevent cracking between the graphite and the coating at the sublimation temperature.

20. A method according to claim 19 wherein the material coating the graphite is a refractory metal compound selected from the group consisting of tantalum carbide, hafnium carbide, niobium carbide, titanium carbide, zirconium carbide, tungsten carbide, vanadium carbide, tantalum nitride, hafnium nitride, niobium nitride, titanium nitride, zirconium nitride, tungsten nitride, vanadium nitride and mixtures thereof.

21. A method according to claim 20 wherein the refractory metal compound comprises tantalum carbide.

22. A method according to claim 19 wherein the carbon source gas comprises ethylene.

* * * * *